(12) United States Patent
Qu

(10) Patent No.: US 8,445,324 B2
(45) Date of Patent: May 21, 2013

(54) METHOD OF WAFER-LEVEL FABRICATION OF MEMS DEVICES

(75) Inventor: Hongwei Qu, Rochester Hills, MI (US)

(73) Assignee: Oakland University, Rochester, MI (US)

( * ) Notice: Subject to any disclaimer, the term of this patent is extended or adjusted under 35 U.S.C. 154(b) by 199 days.

(21) Appl. No.: 12/928,542

(22) Filed: Dec. 14, 2010

(65) Prior Publication Data

US 2011/0140216 A1   Jun. 16, 2011

Related U.S. Application Data

(60) Provisional application No. 61/284,283, filed on Dec. 16, 2009.

(51) Int. Cl.
*H01L 21/00*      (2006.01)
*H01L 21/302*    (2006.01)
*H01L 21/461*    (2006.01)

(52) U.S. Cl.
USPC ............... 438/110; 438/734; 257/E23.004; 257/E21.218

(58) Field of Classification Search ............ 438/712, 438/110, 734, 737
See application file for complete search history.

(56) References Cited

U.S. PATENT DOCUMENTS

| | | | |
|---|---|---|---|
| 4,732,646 A * | 3/1988 | Elsner et al. | 438/694 |
| 5,717,631 A | 2/1998 | Carley et al. | |
| 5,970,315 A | 10/1999 | Carley et al. | |
| 6,458,615 B1 | 10/2002 | Fedder et al. | |
| 6,705,166 B2 | 3/2004 | Leonardson | |
| 6,905,614 B1 * | 6/2005 | Novotny | 216/2 |
| 6,925,710 B1 | 8/2005 | Scalf et al. | |
| 6,938,484 B2 | 9/2005 | Najafi et al. | |
| 7,026,184 B2 | 4/2006 | Xie et al. | |
| 7,069,784 B1 | 7/2006 | Eskridge | |
| 7,258,012 B2 | 8/2007 | Xie | |
| 7,479,402 B2 | 1/2009 | Yu | |
| 2004/0146810 A1 * | 7/2004 | Gabriel et al. | 430/322 |
| 2007/0230721 A1 * | 10/2007 | White et al. | 381/166 |
| 2007/0241076 A1 * | 10/2007 | Moffat et al. | 216/2 |

* cited by examiner

*Primary Examiner* — Daniel Luke
(74) *Attorney, Agent, or Firm* — Butzel Long

(57) ABSTRACT

The present disclosure relates to a method of fabricating a micromachined CMOS-MEMS integrated device as well as the devices/apparatus resulting from the method. In the disclosed method, the anisotropic etching (e.g., DRIE) for isolation trench formation on a MEMS element is performed on the back side of a silicon wafer, thereby avoiding the trench sidewall contamination and the screen effect of the isolation beams in a plasma etching process. In an embodiment, a layered wafer including a substrate and a composite thin film thereon is subjected to at least one (optionally at least two) back side anisotropic etching step to form an isolation trench (and optionally a substrate membrane). The method overcomes drawbacks of other microfabrication processes, including isolation trench sidewall contamination.

30 Claims, 7 Drawing Sheets

METHOD OF WAFER-LEVEL FABRICATION OF MEMS DEVICES

CROSS-REFERENCE TO RELATED APPLICATION

Priority is claimed to U.S. Provisional Application No. 61/284,283, filed Dec. 16, 2009, the disclosure of which is incorporated herein in its entirety.

BACKGROUND OF THE DISCLOSURE

1. Field of the Disclosure

This disclosure relates to wafer-level microfabrication methods for micro-electromechanical systems (MEMS) devices. The method can be applied to the fabrication of complementary metal-oxide-semiconductor (CMOS)-MEMS sensors and actuators where electrical isolation of MEMS structures and conditioning circuitry is needed. The method can include an anisotropic etch (e.g., a deep reactive ion etch (DRIE)) from the back-side of a substrate, to create electrical isolation trenches and chip separation trenches; a front-side anisotropic etch (e.g., silicon dioxide in the CMOS layer) to expose silicon sensor structures, and a front-side anisotropic etch (e.g., a substrate DRIE) for MEMS device release. The method avoids the microstructure contamination prevalently existing in other currently available plasma-etch based microfabrication methods that result in structure release failure and, thus, low manufacturing yield.

2. Brief Description of Related Technology

Microfabrication (or micromachining) refers to series of processing techniques used to fabricate devices known as MEMS or micromachined devices (e.g., micromachined inertial sensors such as accelerometers, and other sensors/actuators). MEMS fabrication processes generally involve the sequential addition and removal of layers of materials from a substrate layer using film deposition and etching techniques until a desired structure is obtained. MEMS microfabrication processes largely originate from planar semiconductor processes by which integrated circuits (IC) are manufactured.

Complementary metal-oxide-semiconductor (CMOS)-compatible fabrication processes can be used to create microstructures (or MEMS structures), for example as described in U.S. Pat. Nos. 5,717,631, 5,970,315, 6,458,615, and 7,026,184. Micromachined devices fabricated by CMOS-compatible fabrication processes are attractive because of the ability to integrate high-performance, on-chip signal conditioning circuits with sensing elements, multi-vendor accessibility, and short design cycle times. Such processes can be used to fabricate miniature three-axis accelerometers for use in a variety of applications including automobiles, navigation systems, and medical devices, for example as described in U.S. Pat. No. 7,258,012. CMOS-MEMS processing creates microstructures (e.g., as beams) that are made out of dielectric and metallization layers of CMOS and/or substrate material. One of the CMOS metal layers (or some other layer made from an etch-resistant material) acts as an etch-resistant mask for defining the microstructural side-walls. Reactive-ion etch (RIE) of a CMOS oxide layer creates composite metal/dielectric/substrate material microstructures that can have a favorable aspect ratio (e.g., beam width to beam thickness, gap spacing between adjacent beams to beam thickness). Isotropic etching of the substrate can be performed to electrically isolate portions of the substrate material by removing the substrate material from under a composite micro-structure (e.g., a short, narrow beam). As a result, the substrate material on both sides of the microstructure is electrically isolated but mechanically connected.

Some substantial fabrication limitations have been observed in other CMOS-MEMS processes (e.g., DRIE processes such as those illustrated in references [1-4]). For example, silicon sidewall contamination can be caused by the alternate plasma processing steps performed on the front side of a device die or wafer. The contamination limitation, particularly taking place on the sidewall of electrical isolation trenches, dramatically limits the device release yield. In some cases, additional process steps that are needed to remove the contaminants, can cause the device failure.

Objects

One of the objects of the disclosure is to provide a method for fabricating a micromachined device from a layered wafer including a substrate (e.g., silicon substrate) and one or more composite thin films thereon, in particular where trench and channel structures in the substrate can be formed without etching through the composite thin films from the front side of the device to access/further etch the substrate.

Another object is to eliminate the occurrence of trench sidewall contamination (e.g., metal and polymer contamination such as aluminum and fluorocarbon-based polymers) resulting from a front side etching of the substrate through the composite thin film (e.g., etching through a CMOS thin film layer stack to form trenches in an underlying (silicon) substrate).

Yet another object is to improve the speed and yield of fabrication processes for micromachined devices by eliminating sidewall contamination, reducing the overall number of steps in the process, and facilitating wafer-level device fabrication (e.g., with improved microstructure release and die separation).

These and other objects may become increasingly apparent by reference to the following description.

SUMMARY

The disclosure relates to a method of fabricating a micromachined device. The method generally includes: (a) providing a wafer comprising (i) a substrate having (A) a front side surface and (B) a back side surface opposing the front side surface, (ii) a composite thin film on the front side surface of the substrate, the composite thin film comprising one or more etchable portions and one or more etch-resistant portions, and (iii) an etch mask on the back side surface of the substrate, the etch mask defining one or more isolation portions substantially aligned with the etchable portions of the composite thin film; (b) anisotropically etching the back side of the substrate via the isolation portions of the etch mask, thereby forming one or more first isolation trenches, wherein the first isolation trenches (i) are substantially aligned with the etchable portions of the composite thin film and (ii) extend partially into the substrate; (c) removing the etch mask; (d) anisotropically etching the back side of the substrate via the first isolation trenches, thereby extending the first isolation trenches to form one or more second isolation trenches, wherein the second isolation trenches (i) are substantially aligned with the etchable portions of the composite thin film and (ii) extend through the substrate to the composite thin film; and (e) anisotropically etching the etchable portions of the composite thin film from front side, thereby defining one or more final isolation trenches from the removed etchable portions of the composite thin film and the second isolation trenches; and (f) optionally anisotropically etching the remaining substrate from the front side to release the device structures.

The etch mask can include a patterned photoresist layer and optionally a patterned insulating layer (e.g., low-temperature silicon oxide ($SiO_2$) as DRIE etch resistant) between the back side surface of the substrate and the patterned photoresist layer. In an embodiment, (i) the patterned insulating layer defines a microstructure region on the back side surface of the substrate; and (ii) step (d) further comprises anisotropically and isotropically etching (e.g., DRIE) the back side surface of the substrate in the microstructure region, thereby forming a substrate membrane in the microstructure region. In another embodiment, (i) the etch mask further defines one or more separation portions; (ii) step (b) further comprises anisotropically etching the back side surface of the substrate via the separation portions of the etch mask, thereby forming one or more first separation trenches, wherein the first separation trenches extend partially into the substrate; and (iii) step (d) further comprises anisotropically etching the back side surface of the substrate via the first separation trenches, thereby extending the first separation trenches to form one or more second separation trenches, wherein the second separation trenches extend through the substrate to the composite thin film layer on the front side surface of the substrate.

The disclosure also relates to another method of fabricating a micromachined device, the method comprising: (a) providing a wafer comprising (i) a substrate (e.g., single-crystal substrate, such as single-crystal silicon, Si/Ge, and GaAs) having (A) a front side surface, (B) a back side surface opposing the front side surface, and (C) a substrate thickness between the front side surface and the back side surface, and (ii) a composite thin film having (A) a front side surface and (B) a back side surface on the front side surface of the substrate, the composite thin film comprising one or more etchable portions and one or more etch-resistant portions; (b) depositing an insulating layer (e.g., DRIE etching resistant, such as a low temperature oxide, nitride, etc.) over the back side surface of the substrate; (c) patterning the insulating layer (e.g., using RIE etching), thereby forming one or more isolation (i.e., open) portions of the insulating layer, wherein the isolation portions of the insulating layer are substantially aligned with the etchable portions of the composite thin film on the front side; (d) depositing a photoresist layer over the back side surface of the substrate and over the isolation portions of the insulating layer; (e) patterning the photoresist layer, thereby defining one or more isolation portions of the photoresist layer, wherein the isolation portions of the photoresist layer are substantially aligned with the etchable portions of the composite thin film; (f) etching (e.g., RIE) the isolation portions of the insulating layer via the isolation portions of the photoresist layer, thereby exposing the back side surface of the substrate; (g) anisotropically etching (e.g., DRIE) the back side of the substrate via the isolation portions of the photoresist layer, thereby forming one or more first isolation trenches, wherein the first isolation trenches (i) are substantially aligned with the etchable portions of the composite thin film on the front side and (ii) extend partially into the substrate; (h) removing the photoresist layer; (i) anisotropically etching (e.g., DRIE) the back side of the substrate via the patterned portion of the first isolation trenches, thereby extending the first isolation trenches to form one or more corresponding second isolation trenches, wherein the second isolation trenches (i) are substantially aligned with the etchable portions of the composite thin film and (ii) extend through the substrate to, but not through, the composite thin film on the front side surface of the substrate; and (j) anisotropically etching the etchable portions of the composite thin film from the front side surface of the composite thin film and through the composite thin film to the second isolation trenches, thereby defining one or more final isolation trenches from the removed etchable portions of the composite thin film and the second isolation trenches.

Various modifications and extensions to the foregoing methods are possible. In an embodiment, (i) step (c) further comprises forming a microstructure region on the back side surface of the substrate, the microstructure region being defined by remaining portions of the patterned DRIE resistant layer and the isolation portions of the resistant layer; (ii) step (i) further comprises anisotropically and isotropically etching the back side of the substrate in the microstructure region, thereby forming a substrate membrane (e.g., having a membrane thickness ranging from about 10 μm to about 100 μm) in the microstructure region; and/or (iii) the composite thin film comprises at least one structural isolation etchable portion that does not correspond to a formed second isolation trench in the microstructure region, step (j) further comprises anisotropically etching the structural isolation etchable portion to expose the underlying substrate, and the method further comprises (k) anisotropically etching the substrate from the front side through the etched structural isolation etchable portion to form a structural trench permitting movable device structures and device release. The final isolation trenches can extend through the substrate membrane and have a width ranging from about 5 μm to about 15 μm. Additionally, the final isolation trenches have an aspect ratio ranging from about 5:1 to about 10:1, the aspect ratio being defined as the height:width ratio of the etched isolation trenches and determined by the control capability of the DRIE etcher used. In another embodiment, (i) step (e) further comprises defining one or more separation portions of the photoresist layer; (ii) step (g) further comprises anisotropically etching the back side of the substrate via the separation portions of the photoresist layer, thereby forming one or more first separation trenches, wherein the first separation trenches extend partially into the substrate; and (iii) step (i) further comprises anisotropically etching the back side of the substrate via the first separation trenches, thereby extending the first separation trenches to form one or more second separation trenches, wherein the second separation trenches extend through the substrate to, but not through, the composite thin film layer on the front side surface of the substrate. In another embodiment, (i) the composite thin film layer comprises a CMOS circuitry layer stack; (ii) the etchable portion comprises an insulating material (e.g., oxide) on the front side surface of the substrate; and (iii) the etch-resistant portion comprises one or more metal layers on the front side surface of the substrate (e.g., aluminum, copper) separated by the insulating material. In another embodiment, (i) the wafer is indexed to permit double-sided alignment of the wafer when etching from the front side of the substrate and from the back side of the substrate; and (ii) the method further comprises flipping over the wafer after the second back side anisotropic etching of the substrate and before the front side etching of the composite thin film layer.

The disclosure also relates to a micromachined device (e.g., accelerometer) formed according to the foregoing methods in any of their various embodiments, or a micromachined device incorporating a structural element formed according to the foregoing methods in any of their various embodiments (e.g., trenches formed in a silicon substrate under one or more CMOS layers, with the trenches being free or substantially free of sidewall metal contamination and polymer contamination such as aluminum and fluorocarbon-based polymers). For example, substrate sidewalls of isolation trenches (e.g., the final isolation trenches) formed according to the disclosed methods are generally free or substantially free of contaminants deposited or otherwise derived from the composite thin film (e.g., contaminants derived from the non-etchable portions thereof), such as contaminants comprising metal components of the composite thin film (e.g., aluminum, copper, or other metal CMOS layer). Put another way, any sidewall contamination that might arise according to the disclosed methods is less than an equivalent level of sidewall contamination that would arise using a front-side etching technique to form an isolation trench via an already etched composite thin film/CMOS layer.

All patents, patent applications, government publications, government regulations, and literature references cited in this specification are hereby incorporated herein by reference in their entirety. In case of conflict, the present description, including definitions, will control.

Additional features of the disclosure may become apparent to those skilled in the art from a review of the following detailed description, taken in conjunction with the examples, drawings, and appended claims, with the understanding that the disclosure is intended to be illustrative, and is not intended to limit the claims to the specific embodiments described and illustrated herein.

BRIEF DESCRIPTION OF THE DRAWINGS

For a more complete understanding of the disclosure, reference should be made to the following detailed description and accompanying drawings wherein.

Figure 1:
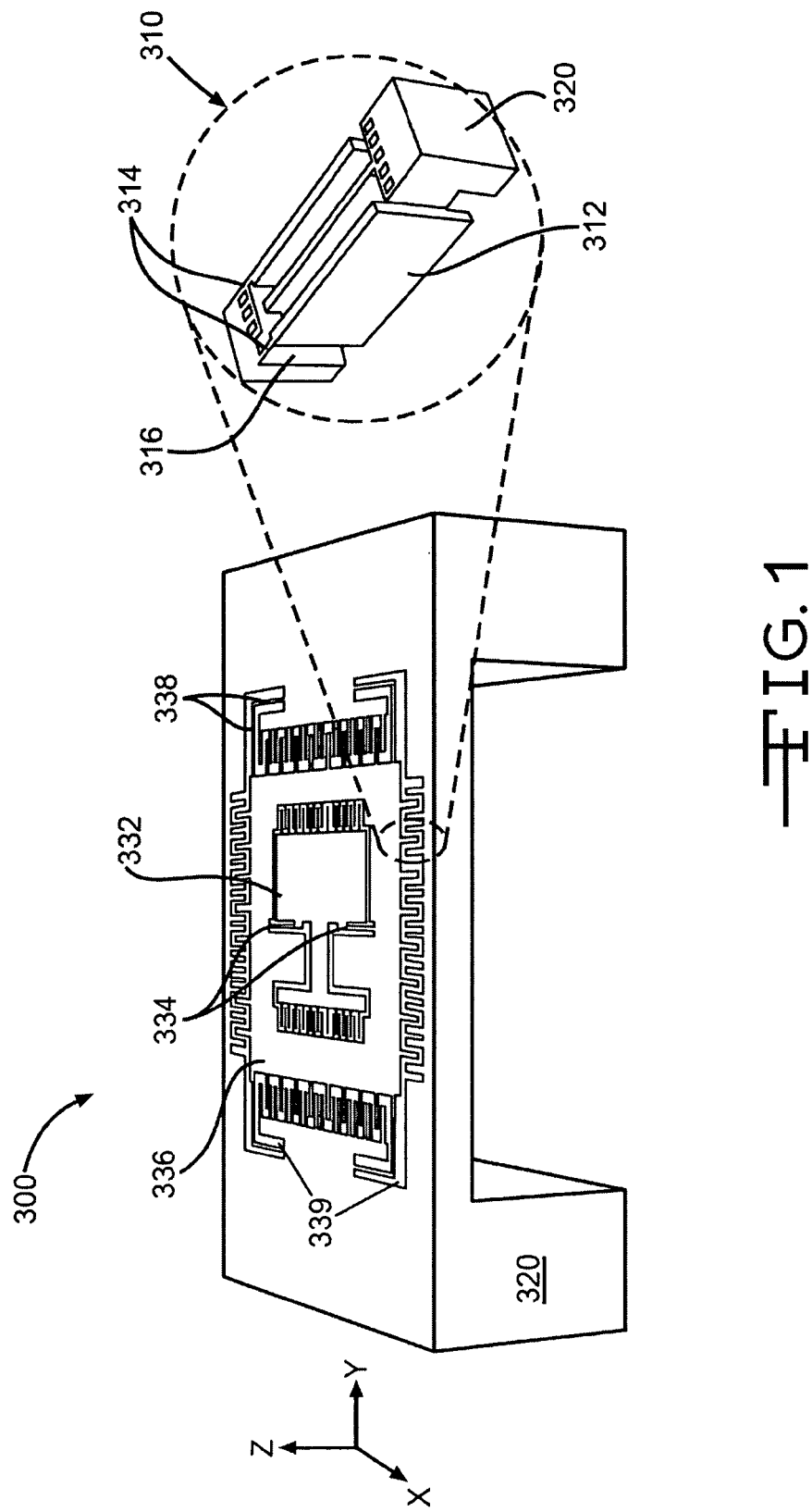
FIG. 1 illustrates a perspective view of a three-axis accelerometer (inset: detail of sensing comb fingers and electrical isolation thin films).

While the disclosed compositions and methods are susceptible of embodiments in various forms, specific embodiments of the disclosure are illustrated in the drawings (and will hereafter be described) with the understanding that the disclosure is intended to be illustrative, and is not intended to limit the claims to the specific embodiments described and illustrated herein.

DETAILED DESCRIPTION

The present disclosure relates to a method of fabricating a micromachined device as well as the devices/apparatus resulting from the method. In the disclosed method, the anisotropic etching (e.g., DRIE) for isolation trench formation is performed on the back side of a silicon wafer, thereby avoiding the trench sidewall contamination and the screen effect of the isolation beams in a plasma etching process. The method overcomes drawbacks of other microfabrication processes, including isolation trench sidewall contamination.

In the disclosed method, a wafer is initially provided that includes (i) a substrate, (ii) a composite thin film on the front side surface of the substrate, and (iii) an etch mask on the back side surface of the substrate. The composite thin film includes one or more etchable portions and one or more etch-resistant portions, and the etch mask includes one or more isolation portions (e.g., gaps in the etch mask exposing the substrate back side) that are substantially aligned with the etchable portions of the composite thin film. The back side surface of the substrate is anisotropically etched via the isolation portions of the etch mask to form one or more first isolation trenches. The first isolation trenches are substantially aligned with the etchable portions of the composite thin film and extend partially into the substrate. After removing the etch mask, the back side surface of the substrate is anisotropically etched further via the first isolation trenches to extend the first isolation trenches and form corresponding second isolation trenches therefrom. The second isolation trenches are substantially aligned with the etchable portions of the composite thin film and extend through the substrate to the composite thin film. The etchable portions of the composite thin film are anisotropically etched (e.g., from the front side surface of the substrate and through the composite thin film to the second isolation trenches), thereby defining one or more final isolation trenches from the removed etchable portions of the composite thin film and the second isolation trenches. Due to the considerable depth of the second isolation trench formed after the back side etching and the generally poor selectivity of silicon etching rate over the composite thin film etching, the composite thin film is suitably not etched from back side through the second isolation trench in order to avoid subsequent damage and/or contamination of the isolation trenches. Additional features of the method include the formation of a thin substrate membrane region in the micromachined device and the formation of additional separation trenches for neighboring elements in the micromachined device. The final isolation trenches can form structural elements as part of a larger MEMS device, for example including an accelerometer.

FIG. 1 illustrates a perspective view of a three-axis accelerometer 300. The inset shows a sensing element 310 that includes sensing electrodes 312 with thin-film beams 314 for electrical isolation provided by trenches 316 defined between neighboring electrode 312 structures and substrate 320. The isolation composite thin films 314, which can consist of alternate layers of silicon dioxide ($SiO_2$) and metal (Al), separate the single-crystal silicon (SCS) on the capacitive sensing electrodes 312 from the substrate 320 to provide electrical isolation and physical connection of the electrodes. As illustrated, the three-axis accelerometer 300 includes a plurality of the sensing elements 310 distributed in a generally planar, conventional spatial arrangement so that they can detect lateral acceleration forces (e.g., in the x- and y-directions generally coplanar with the flat accelerometer 300 structure) through motion/deflection of a lateral proof mass 336 via lateral springs 338 as well as vertical acceleration forces (e.g., in the z-direction generally normal to the flat accelerometer 300 surface) through motion/deflection of a z-axis proof mass 332 via z-axis torsional springs 334. Gaps/trenches 339 in the composite thin film and/or substrate between different accelerometer components (e.g., sensing elements, sensing electrodes thereof, springs, proof masses) permit independent directional movement between adjacent sensing electrodes, which movement can be correlated to an induced direction force relative to the accelerometer as a whole based on the spatial arrangement of the particular sensing electrodes. In other existing fabrication processes, the isolation trench formation is performed by front-side etching of the device (e.g., according to the process described in reference [3]).

Figure 2:
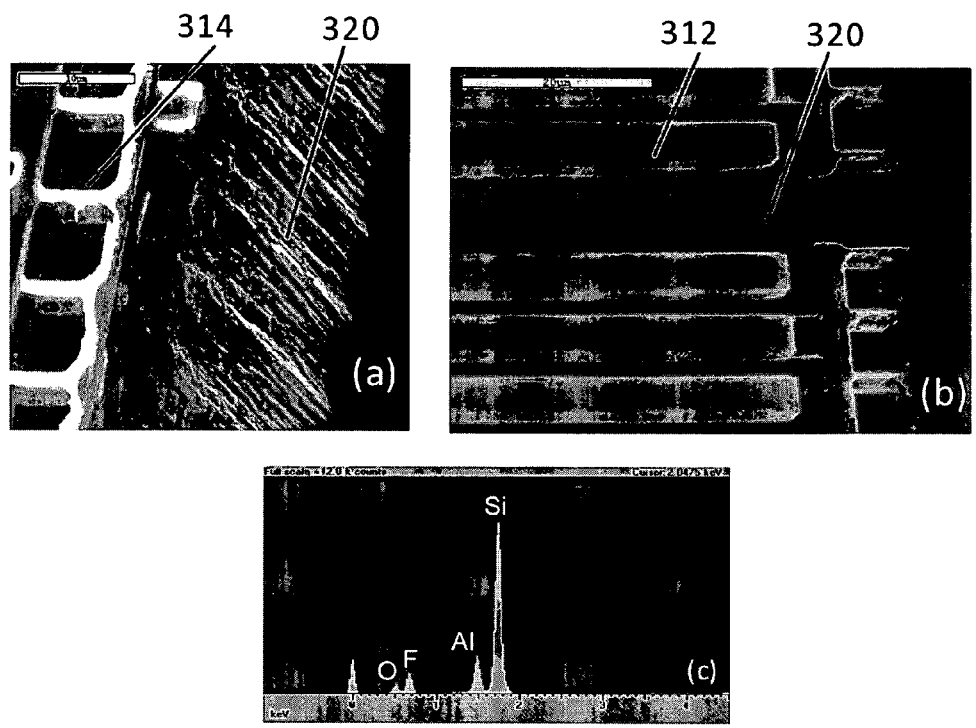
FIG. 2 presents scanning electron microscopy (SEM) images and energy dispersive spectroscopy (EDS) analysis of contamination formed on isolation trench sidewalls. SEM image (a) (scale bar: 10 μm) illustrates the bowed sidewall after the device is etched through using the existing method in which the substrate etching was performed from the front side through the holes between the isolation beams. The bowed shape and roughness of the sidewall are caused by the screen effect of the isolation beams in the etching. SEM image (b) (scale bar: 20 μm) illustrates the sidewall after the front side $SiO_2$ etch. EDS analysis graph (c) presents the results of the region in (b) indicated as the sidewall/substrate 320.

As shown in the inset of FIG. 1, the isolation trench 316 is formed by removing the bulk silicon 320 between and beneath the isolation beams 314. FIGS. 2(a) and 2(b) show one side of the isolation trench 316 with broken isolation beams 314 in a real device. Due to the screening (scattering) effect of the isolation beams 314 in the etch steps performed from the front side, a bowed and rough isolation trench sidewall 320 is formed. The polymer (a fluorocarbon deposited from an octafluorocyclobutane ($C_4F_8$) passivation gas in RIE and DRIE processing steps) and aluminum particles scattered from the isolation beams 314 are prone to deposit on the rough sidewall of the substrate 320. FIG. 2(c) is a compositional analysis result of the contaminant on the sidewall 320 in the area shown in FIG. 2(b). The EDS result shows fluoride polymer and aluminum as the main contaminants. The contaminant particles act as micro-masks in subsequent etch steps, preventing the silicon underneath from being etched away. Consequently, the movable parts of the MEMS device remain connected to the unmovable parts, resulting in the failure of the device.

Figure 3:
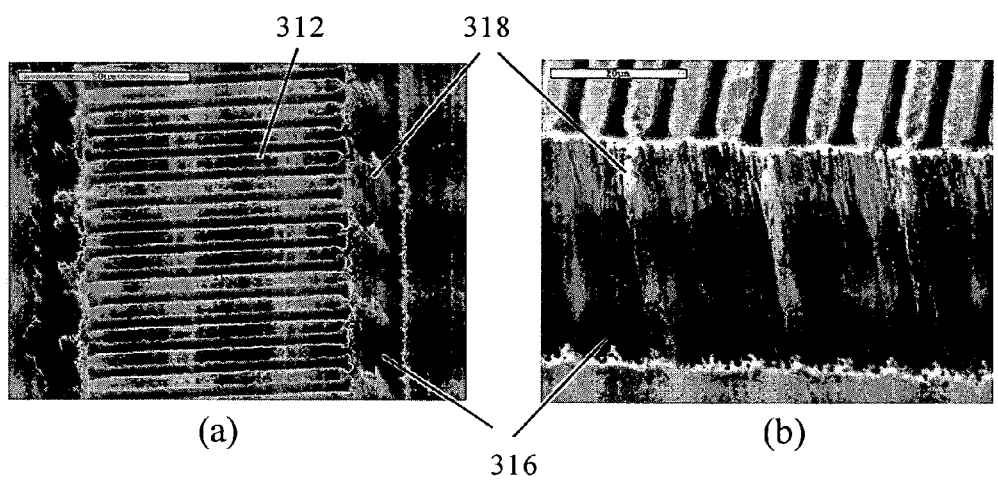
FIG. 3 presents SEM images (scale bars: 50 μm (a) and 20 μm (b)) of the silicon micro connections on the comb finger ends caused by the micro mask effect of the contaminants on the sidewalls of isolation trenches during the front side etching.

FIG. 3 shows the backside view of the comb fingers 312 after the device etch-through. Due to the micro mask effect of the contaminants on the sidewalls, thin silicon walls 318 are formed along the comb finger 312 ends at the bottom of the isolation trenches 316. They connect rotor (movable) comb fingers 312 and stator (fixed) comb fingers 312 together, making the proof mass (e.g., z-axis proof mass 332, lateral proof mass 336) unmovable. This effect is the main reason for failure during device release. Since no lithography can be performed on the etched-through device, any additional etching processes intended to remove the silicon connections in FIG. 3 will damage other microstructures, thus causing device failure.

Method of Fabrication

A representative method of fabricating a micromachined device 40 according to the disclosure is illustrated in FIGS. 4 and 4A-4H (e.g., with only one chip exemplified).

Figure 4:
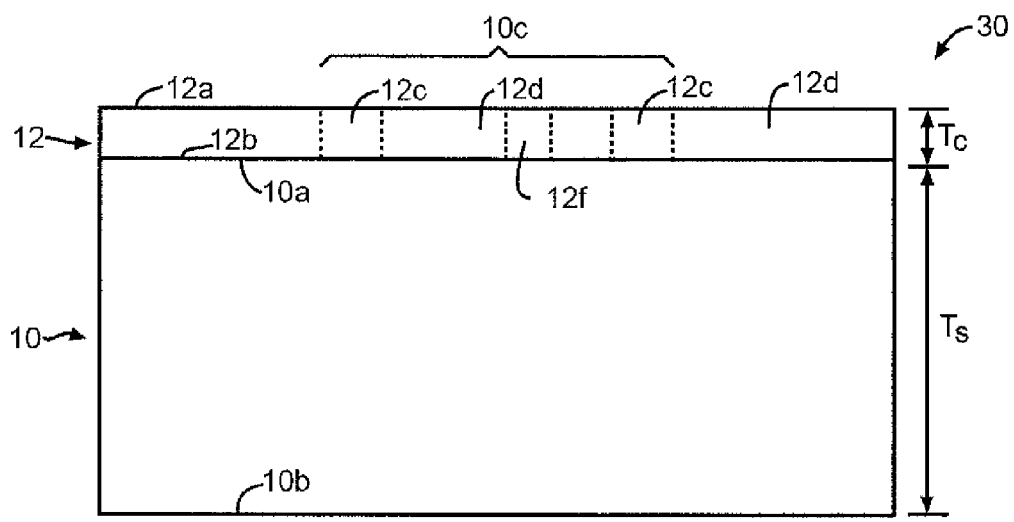
FIGS. 4 and 4A-4H illustrate cross sectional views of a wafer processed with a CMOS-MEMS microfabrication method according to the disclosure, which method intends to resolve the problems as shown above that are caused by the existing fabrication processes.

FIG. 4 shows a wafer 30 that includes a substrate 10 and a composite thin film 12. The substrate 10 has a front side surface 10a, a back side surface 10b opposing the front side surface 10a, and a substrate thickness $T_s$ between the front side surface 10a and the back side surface 10b. The terms "front" and "back" are arbitrary and represent opposing surfaces (e.g., first and second opposing faces/surfaces of a thin, flat substrate). "Front" and "back" also can be directional indicators and/or can represent intermediate surfaces modified by the method steps (e.g., in FIG. 4D, the substrate back side can represent the remaining portions of the original back side surface 10c as well as the substrate surface contours following the formed trenches 18a and 20a). The substrate 10 can be formed from a semiconductor material, for example including silicon or a group III-V semiconductor (e.g., single-crystal silicon (SCS), Si/Ge, GaAs). Prior to etching, the substrate thickness $T_s$ suitably can range from 200 μm to 1000 μm or from 400 μm to 650 μm. Due to the limit of aspect ratio in etching process, the minimum isolation trench width is also determined by $T_s$. Un-etched portions of the substrate 10 can be referenced as the "bulk" substrate 10.

The composite thin film 12 is formed on or above (i.e., taking into account possible intermediate adhesion layers) the front side surface 10a of the substrate 10. Similar to the substrate 10, the composite thin film 12 also has opposing front side and back side surfaces 12a and 12b, respectively, with the substrate 10 and the composite thin film 12 having a front-to-back spatial arrangement. The internal structure of the composite thin film 12 is such that it contains etchable portions 12c, 12f and etch-resistant portions 12d (e.g., which generally surround and define the neighboring etchable portions 12c). The echable portion 12c defines the position of subsequent electrical isolation structure, while the etchable portion 12f defines the position of subsequent structural isolation of other MEMS structures such as comb drives and mechanical springs. The etchable portions 12c and 12f can be removed preferably by any suitable dry etching process such that the composite thin film 12 can be removed (e.g., completely, through the entire thickness $T_c$ thereof) in the neighborhood of the etchable portions 12c and 12f, thereby exposing the underlying substrate 10 (or a trench previously formed therein). Conversely, the etch-resistant portions 12d as a whole are not substantially removed by the dry etching processes, thereby preventing exposure of the underlying substrate 10, even though individual components or layers of the etch-resistant portions 12d may be removed. The etchable portions 12c can define a MEMS region 10c on the substrate 10, the MEMS region 10c representing a region that includes etchable portions 12c where the substrate 10 is to be eventually etched to form a MEMS device structure (e.g., with a thin substrate membrane). The thickness $T_c$ of the composite thin film 12 suitably can range from 1 μm to 10 μm or from 5 μm to 7 μm.

Figure 4A:
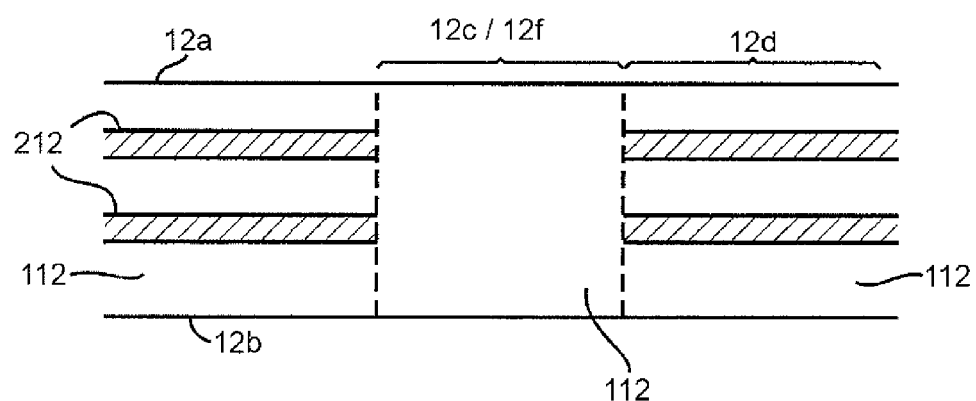

The detail cross section of FIG. 4A illustrates an embodiment in which the composite thin film 12 includes a circuitry layer stack, for example a CMOS circuitry layer stack formed according to conventional CMOS processing techniques. In the illustrated CMOS circuitry layer stack 12, a single etchable portion 12c or 12f includes an insulating/dielectric material 112 (e.g., oxide materials such as silicon dioxide) on the front side surface 10a of the substrate 10, and the etch-resistant portion 12d includes the insulating material 112 on the front side surface 10a of the substrate 10 and one or more etch-resistant metallic layers 212 (e.g., including aluminum (Al) and/or copper (Cu)) separated by the insulating material 112. Thus, an anisotropic etching process applied to the front side surface 12a of the CMOS circuitry layer stack 12 generally would be capable of removing substantially all of the insulating material 112 in the etchable portions/regions 12c and 12f, while the metallic layers 212 in the etch-resistant portions 12d generally would prevent exposure of the substrate 10, although the insulating material 112 between the uppermost metal layer 212 and the front side surface 12a could, in general, be removed.

Figure 4B:
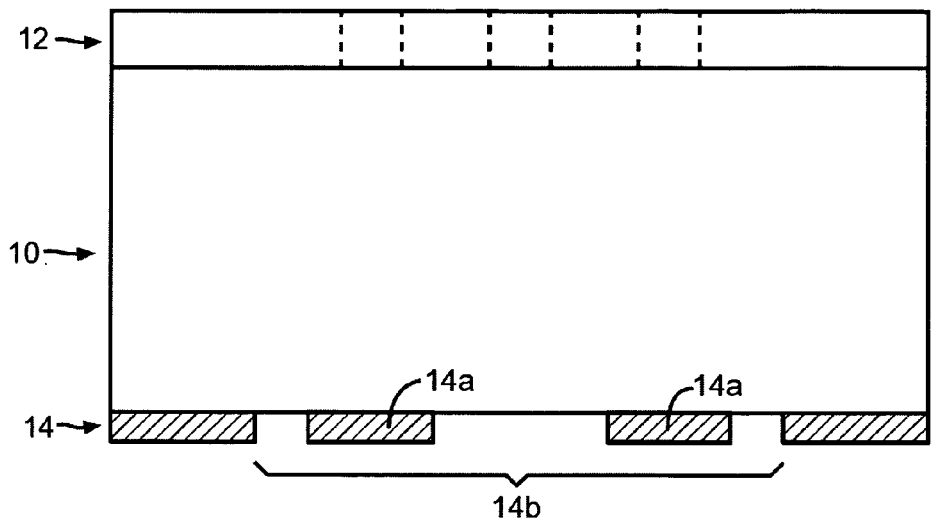

FIG. 4B illustrates a step in the method in which an insulating/dielectric layer 14 (e.g., RIE and/or DRIE-resistant, formed from an oxide or a nitride material) is deposited and patterned on (or over) the back side surface 10b of the substrate 10. Patterning of the insulating layer 14 forms one or more isolation portions 14a of the insulating layer 14. The isolation portions 14a are positioned to generally correspond to the eventual location of isolation trenches formed in the substrate 10. For example, a thin layer of silicon dioxide (e.g., about 1 to 3 μm thick) can be deposited on the back side surface 10b of the substrate 10 using a low-temperature plasma-enhanced chemical vapor deposition (PECVD) process to form the insulating layer 14. The silicon dioxide can then be patterned using photolithography to form the patterned insulating layer 14 shown in FIG. 4B. As illustrated, the isolation portions 14a are substantially aligned with the etchable portions 12c. "Alignment" or "substantial alignment" refers to a spatial arrangement in which a given isolation portion 14a at least partially (preferably completely, to within the tolerance of the etching processes, in the case of complete alignment) overlaps a corresponding etchable portion 12c, when viewed along an axis that is substantially perpendicular to a plane defined by the substrate 10 (e.g., the front or back surface thereof). An analogous interpretation applies to other structural elements that are aligned or substantially aligned. Patterning of the insulating layer 14 further results in a MEMS region 14b in the area where the insulating layer 14 has been removed by the patterning step to expose the back side surface 10b of the substrate. The MEMS regions 10c and 14b are substantially co-aligned.

Figure 4C:
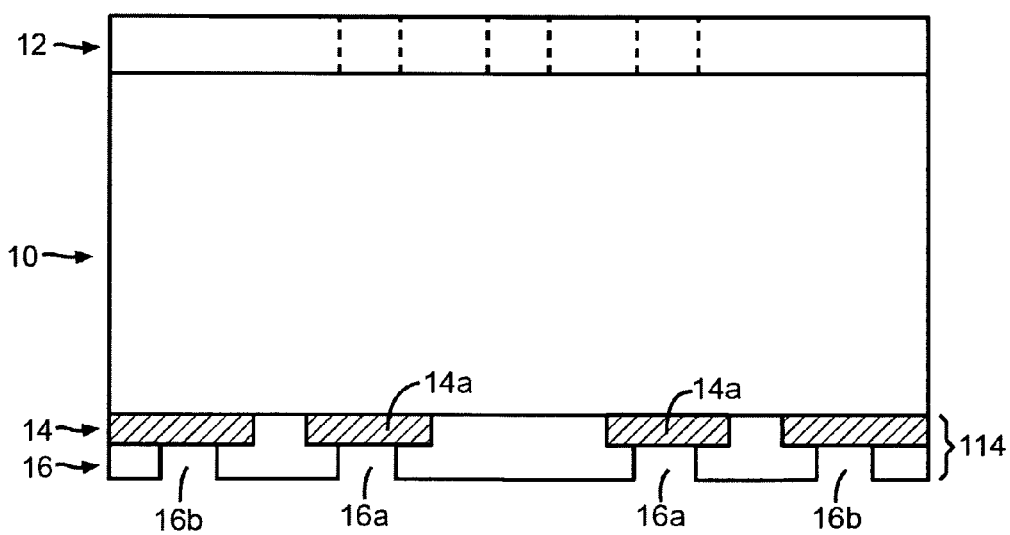

FIG. 4C illustrates subsequent steps in the method in which a photoresist layer 16 is deposited over the exposed back side surface 10b of the substrate 10 (e.g., including the MEMS region 14b) and over the patterned insulating layer 14 (e.g., including the isolation portions 14a). The photoresist layer 16 is then patterned to create isolation portions 16a and separation portions 16b in the patterned photoresist layer 16. The isolation portions 16a (e.g., gaps in the photoresist layer 16 that expose the underlying isolation portions 14a) are generally located to define the position of eventual isolation trenches (e.g., for comb drive electrodes in an accelerometer) and are substantially aligned with the etchable portions 12c of the composite thin film 12 (e.g., over the isolation portions 14a as illustrated).

Similarly, the separation portions 16b (e.g., gaps in the photoresist layer 16 that expose the underlying insulating layer 14) are generally located to define the position of eventual chip separation lines (or trenches) and are generally not aligned with the etchable portions 12c of the composite thin film 12 (i.e., the separation portions 16b are generally opposite an etch-resistant portion 12d of the composite thin film 12). As illustrated in FIG. 4C, the patterned insulating layer 14 and the patterned photoresist layer 16 collectively form an etch mask 114 having one or more isolation portions that are substantially aligned with etchable portions 12c (e.g., the photoresist isolation portions 16a that expose the isolation portions 14a of the insulating layer 14). In an embodiment, the photoresist layer 16 can be a commercially available thick photoresist (e.g., AZ9260 or AZ5240, available from Micro-Chemicals GmbH, Germany). The thick photoresist can be patterned using known photolithography methods in which an exposed photoresist layer is removed by wet etching using a developer.

In a subsequent step (not illustrated), the isolation portions 14a of the insulating layer 14 (e.g., which is DRIE-resistant) are etched via the isolation portions 16a of the photoresist layer 16, thereby exposing the back side surface 10b of the substrate 10. Similarly, the portion of the insulating layer 14 exposed by the separation portions 16b also is etched. Any suitable etching process may be used, for example including a reactive ion etching (RIE) process (e.g., as described in U.S. Pat. Nos. 5,717,631 and 6,458,615).

Figure 4D:
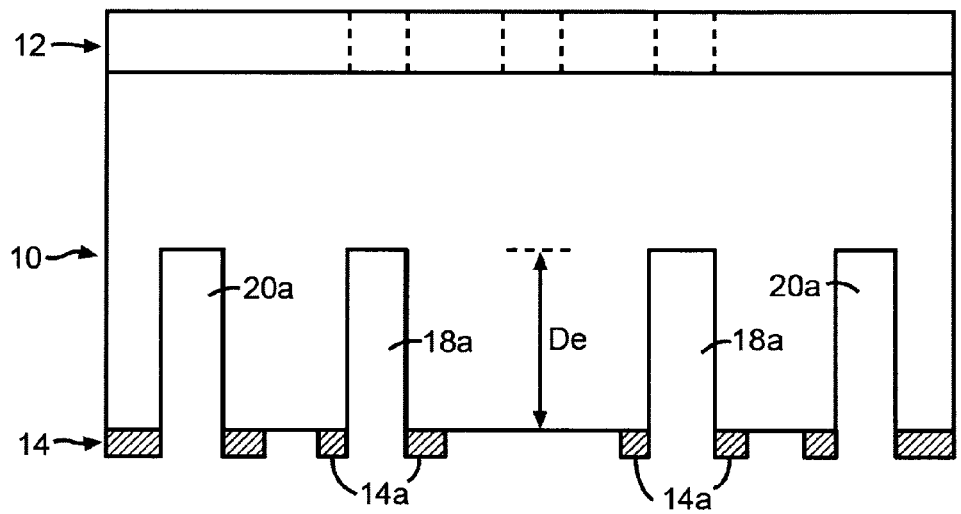
Figure 4E:
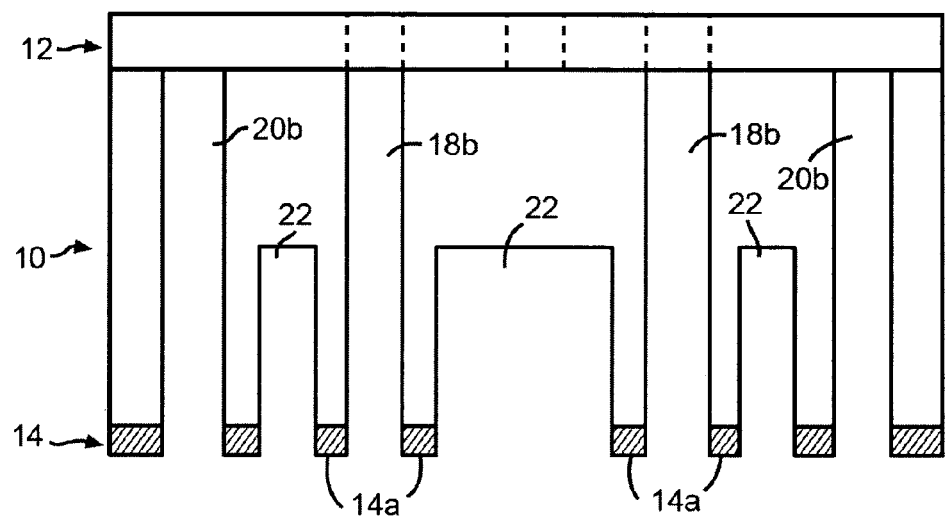

The back side surface 10b of the substrate 10 is then anisotropically etched via the isolation portions 16a of the photoresist layer 16 (e.g., after removal of portions of the patterned insulating layer 14 in the previous step to expose the substrate 10). As illustrated in FIG. 4D, this first back side anisotropic etching step forms one or more first isolation trenches 18a extending into the substrate 10 through the back side surface 10b at a location defined by the position of the photoresist isolation portions 16a. The first isolation trenches 18a are substantially aligned with the etchable portions 12c of the composite thin film 12 and extend partially into the substrate 10 by a depth/distance $D_e$ relative to the back side surface 10b. The distance $D_e$ is less than the substrate thickness $T_s$ and can generally correspond to the eventual membrane thickness of the substrate 10 in the MEMS region 10c. The distance $D_e$ suitably ranges from 10 μm to 200 μm, 20 μm to 150 μm, or 50 μm to 100 μm, depending on the desired final membrane thickness. The first back side anisotropic etching step additionally forms one or more first separation trenches 20a (e.g., also having a depth $D_e$) extending into the substrate 10 through the back side surface 10b at a location defined by the position of the photoresist separation portions 16b. The photoresist layer 16 is then removed (e.g., using $O_2$ plasma) to expose the patterned insulating layer 14 and to obtain the structure shown in FIG. 4D.

Once the photoresist layer 16 is removed, the back side surface 10b of the substrate 10 is anisotropically etched again with a second back side anisotropic etching step using the patterned insulating layer 14 as an etching mask. The second back side anisotropic etching step extends the first isolation trenches 18a (i.e., through the remaining portions of the isolation portions 14a) to form one or more corresponding second isolation trenches 18b. The second isolation trenches 18b are substantially aligned with the etchable portions 12c of the composite thin film 12 and extend through the substrate 10 to (but preferably not through or into) the composite thin film 12 on the front side surface 10a of the substrate 10. Similarly, the second back side anisotropic etching step extends the first separation trenches 20a (i.e., through the patterned insulating layer 14) to form one or more corresponding second separation trenches 20b that extend through the substrate 10 to (but preferably not through) the composite thin film 12 on the front side surface 10a of the substrate 10. Additionally, the second back side anisotropic etching step also removes substrate material in previously unetched portions of the substrate 10 (e.g., in the MEMS region 14b exposed by the removal of the photoresist layer 16) to form one or more large recess regions 22 (or channels/trenches when resulting in relatively narrow recess regions) generally located between (i) two neighboring second isolation trenches 18b and/or (ii) a second isolation trench 18b and a neighboring second separation trench 20b (e.g., separated from the adjacent trenches 18b/20b by an intervening portion of the substrate 10).

The first and second back side anisotropic etching steps can be performed by any suitable anisotropic etching process. In an embodiment, the anisotropic etching is suitably performed using a DRIE process (e.g., as described in U.S. Pat. No. 6,458,615). The DRIE process can be used to directionally etch the substrate 10 (e.g., in a direction substantially perpendicular to a plane defined by the substrate 10) and to form trench/isolation structures with a high aspect ratio (depth to width) and substantially vertical sidewalls. The DRIE process incorporates a series of cyclical etching steps followed by passivation/polymerization steps. The etching steps involve isotropic and anisotropic etching with an etch gas (e.g., including sulfur hexafluoride ($SF_6$), oxygen ($O_2$)). The passivation/polymerization steps involve the formation and deposition of a polymer on exposed surfaces of the substrate 10 with a monomer-containing gas (e.g., including an octafluorocyclobutane ($C_4F_8$) monomer, an argon (Ar) carrier). The cyclic combination of etching steps and passivation/polymerization steps results in a highly anisotropic etching process and straight sidewalls of the etched trenches.

Figure 4F:
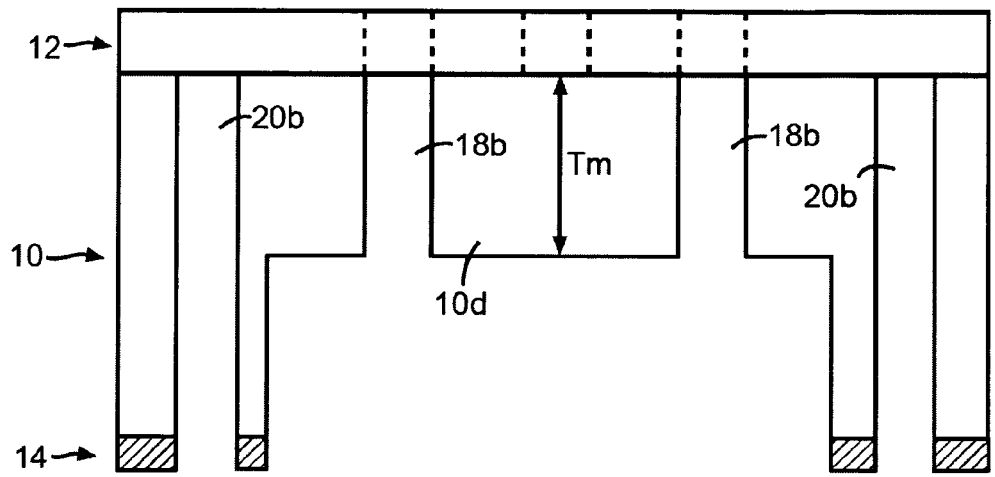

The substrate 10 is then isotropically etched from the back side using an isotropic undercut step to obtain the structure shown in FIG. 4F. The isotropic undercut removes remaining portions of the substrate 10 between neighboring second isolation trenches 18b and recesses/channels 22. The result is the formation of a substrate membrane 10d in the MEMS region 10c of the substrate 10. The substrate membrane 10d has a thickness $T_m$ that suitably ranges from 10 μm to 100 μm, 20 μm to 80 μm, or 30 μm to 70 μm. The maximum $T_m$ is determined by the achievable etching aspect ratio of the smallest feature with a thickness of $T_m$. This isotropic etching step can also tune the profile of the remaining isolation trench 18b. The entrance of isolation trench 18b from the backside will be slightly enlarged, which is favorable for the final DRIE for forming structural trench 21b, as described later. This isotropic etching step can be performed using the same etcher as used for substrate DRIE. To remove the remaining thin walls between the second isolation trenches 18b and the recesses/channels 22, etching parameters of the etcher can be reconfigured for an isotropic etching profile. To achieve an isotropic etching, the chemical gases used will remain the same as in the DRIE etching cycle (e.g., $SF_6$ and $O_2$). However, the etching parameters should be reconfigured. Namely, the DC biasing voltage applied to the chuck where the wafer is mounted is removed. The chunk DC voltage is used to direct the fluoride-based etching ions to reach the bottom of the etched trenches where chemical etching reaction takes place. By removing the DC biasing voltage, isotropic etching can occur. Secondly, the polymer passivation cycle in DRIE, which is used for protection of the sidewalls for anisotropic etching, is removed. This results in continuous isotropic etching. In device design, the isolation portion between recesses/channels 22 and second isolation trench 20b is much wider than the walls between recesses/channels 22 and second isolation trenches 18b. Thus, the entire isolation trench 20b is retained after the walls between recesses/channels 22 and second trenches 18b are isotropically etched. In plasma etching, the etching rate is dependent on the trench aspect ratio. Since the recesses 22 are much wider than second isolation trenches 18b and 20b, the isotropic etching process in this step has very small etching rate on the sidewalls of 18b and 20b. Even during the slight over-etching duration after the walls between recesses 22 and second isolation trenches 18b have been removed, the sidewalls of the remaining second isolation trenches 18b and 20b can be well kept.

Figure 4G:
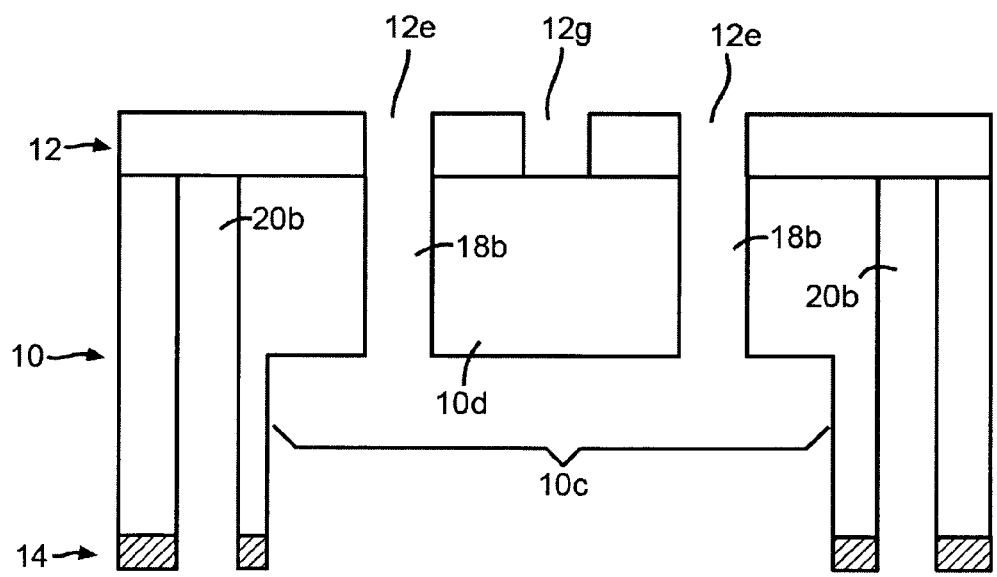
Figure 4H:
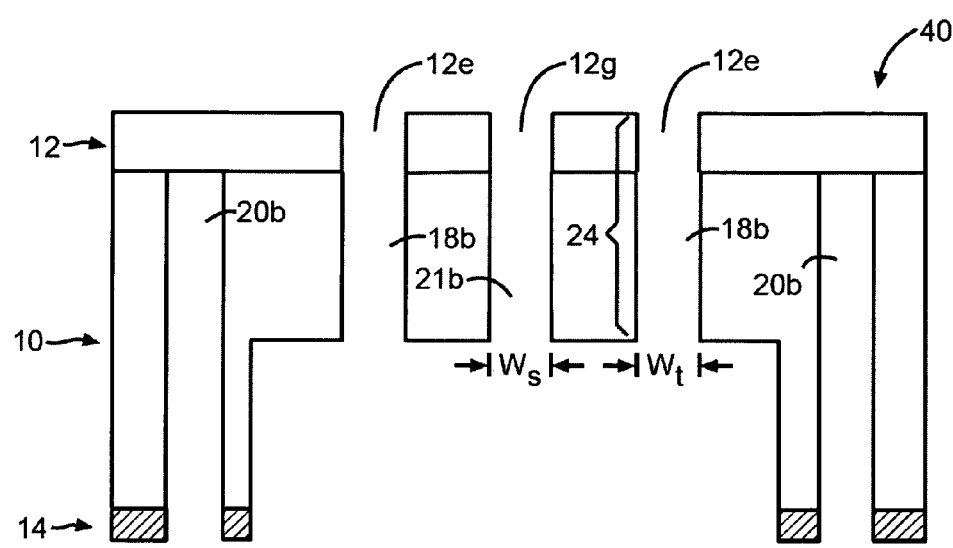

The wafer 30 is flipped over to perform front side etching steps. The etchable portions 12c and 12f (e.g., insulating material 112 such as silicon dioxide) of the composite thin film 12 are anisotropically etched from the front side surface 12a of the film 12. A RIE process as described in U.S. Pat. Nos. 5,717,631 and 6,458,615 can be used for the front side silicon dioxide etch. In this silicon dioxide etch step, an inductive coupled plasma etcher can be used, with $C_2F_6$ or $CHF_3$ as etching gas. To have an anisotropic etching profile, the etcher can be configured to have an appropriate DC biasing voltage for directionality of the etching ions. The top metal layer of thin film 212 can serve as etching mask in this step. The anisotropic etching extends through the composite thin film 12 to the second isolation trenches 18b. As illustrated in FIG. 4G and FIG. 4H, the removed etchable portions 12c and second isolation trenches 18b together define composite isolation trenches 24 that electrically isolate the substrate membrane 10d in the MEMS region 10c from other substrate membrane sections (e.g., neighboring comb drive elements in an accelerometer) and/or from the bulk substrate 10. The composite isolation trenches 24 suitably can have a width $W_t$ ranging from 5 μm to 20 μm. This trench width of $W_t$ is determined by two factors, i.e. (1), the highest trench aspect ratio the DRIE etcher can achieve, and (2), the thickness of the substrate 10. Alternatively or additionally, the composite isolation trenches 24 can be characterized in terms of their aspect ratio (height to width, where the width is the smallest characteristic dimension orthogonal to the height direction, for example the substrate membrane 10d thickness $T_m$ (optionally including the thickness $T_c$ of the composite thin film 12) relative to the isolation trench 24 width $W_t$), which suitably ranges from 5:1 to 10:1. When the composite isolation trenches 12e are etched using RIE from the front side and the isolation trenches 24 are formed, trenches 12g defining sensor structures such as comb drives and mechanical springs, are also etched simultaneously via the etchable portion 12f. A front side DRIE follows to etch through the remaining substrate 10d to form a trench 21b via the trench 12g. The MEMS structures are released once the trench 21b is formed. The width of structural trench 21b, denoted as $W_s$, is determined by the etching aspect ratio the etcher can achieve. For a 5 μm to 50 μm of MEMS thickness $T_m$, the smallest $W_s$ can be about 0.5 μm. The etching efficiency is also considered in determining the smallest $W_s$. This release step and the profile of the completed device is shown in FIG. 4H.

In the disclosed wafer-level fabrication process, a handling wafer to which the working wafer 30 should be attached can be used. For plasma etching, the wafer to be etched should maintain constant temperature for a uniform etching rate. This is achieved by a wafer cooling system on the chuck where the wafer to be etched is mounted. Normally a helium circulation system is used. If the wafer on the chuck is etched through, the leakage of cooling helium into the etching chamber will cause dramatic chamber pressure change and, as a protection measure, the etching process will be forced to stop by the process control unit. Therefore, no through-wafer etching is allowed in DRIE or RIE. Normally, for through-wafer etching or deep trench etching such as the case in this disclosure, the wafer to be etched is placed on a handling wafer, normally a silicon or glass wafer, to prevent helium leakage. The handling wafer is protected by mask material such as photoresist. In this disclosed process, the device or working wafer 30 is attached to a handling silicon wafer. It can be attached to a thick handling wafer using a small amount of regular photoresist applied to designated regions on the handling wafer. Once the backside etching steps are completed, the working wafer 30 can be removed from the handling wafer by removing the photoresist. Then, the working wafer 30 will be flipped and attached to the handling wafer for front side process steps.

In patterning the first isolation layer 14 and the second photoresist layer 16 in the backside etching, double-side alignment is employed. A double-side mask aligner such as EVG-620 (available from EV Group, Austria) can be used. To perform double-side alignment, the patterns on front side are first read by and stored in the aligner as a reference. When patterning (e.g., by photolithography) the first isolation layer 14 and the second isolation layer (photoresist) 16 on the backside, the stored front-side patterns are referenced for alignment. The alignment markers on backside masks (e.g., masks for layers 14 and 16, which are imaged from the front-side alignment markers) should be well aligned to the ones on front side (stored in the imaging system of the aligner). Consequently, the second isolation pattern 16a on the backside, and thus the isolation trench 18b in turn, will be aligned with isolation pattern 12c on the front side. The same is true for the patterning layer 14.

Compared to other methods for forming isolation trenches in CMOS-MEMS structures, the disclosed process has three apparent advantages. Firstly, once the anisotropic etch on the front side is completed (e.g., etching of the silicon dioxide in the etachable portions of the CMOS circuitry layer stack), the method switches to a front side silicon/substrate DRIE step to etch through and release all of the microstructures in the MEMS device. As illustrated in FIG. 4H, isolation trenches (e.g., already formed in the substrate underlying the CMOS circuitry layer stack) are not exposed during the front side anisotropic etching of the CMOS circuitry layer stack. Thus, no contamination (e.g., from aluminum) is introduced into the isolations trenches (e.g., on the sidewalls thereof). This can greatly increase the yield of the method. The profile of the isolation trenches formed from backside etch is also favorable for MEMS structure release. Secondly, when the isolation trenches are etched, the separating trenches for die separation can be formed simultaneously. Therefore, the method is very suitable for wafer-level device fabrication, which is desirable for volume products. Finally, since there is no need for the patterning of isolation trenches on front side, the aluminum etching of a top metal layer in the CMOS circuitry layer stack (e.g., M4 in the process described in reference [3]) is not necessary, and the top metal layer can be omitted from the CMOS circuitry layer stack. Thus, without the additional top metal layer, the total thickness of the CMOS circuitry layer stack on the front side of the substrate is reduced considerably. As a result, the etching time needed for the anisotropic etch on the front side is greatly reduced and the overall process is more efficient.

During the front side RIE etching of portion 12c and 12f of isolation layer, and the front side DRIE of substrate 10 for the formation of the trench 21b, all the other regions on the front side, including circuitry portions, are protected by the mask layer. The mask is normally the top layer of CMOS thin film stack. As an embodiment, the top layer can be a metal layer, e.g. aluminum or copper.

Because other modifications and changes varied to fit particular operating requirements and environments will be apparent to those skilled in the art, the disclosure is not considered limited to the examples chosen for purposes of illustration, and covers all changes and modifications which do not constitute departures from the true spirit and scope of this disclosure.

Accordingly, the foregoing description is given for clearness of understanding only, and no unnecessary limitations should be understood therefrom, as modifications within the scope of the disclosure may be apparent to those having ordinary skill in the art.

Throughout the specification, where the compositions, processes/methods, or apparatus are described as including components, steps, or materials, it is contemplated that the compositions, processes/methods, or apparatus can also comprise, consist essentially of, or consist of, any combination of the disclosed components or materials, unless described otherwise. Component concentrations expressed as a percent are weight-percent (% w/w), unless otherwise noted. Numerical values and ranges can represent the value/range as stated or an approximate value/range (e.g., modified by the term "about"). Combinations of components are contemplated to include homogeneous and/or heterogeneous mixtures, as would be understood by a person of ordinary skill in the art in view of the foregoing disclosure.

References
1. H. Xie and G. K. Fedder, "Vertical comb-finger capacitive actuation and sensing for CMOS-MEMS," *Sensors and Actuators A: Physical*, vol. 95, pp. 212-221, 2002.
2. H. Xie, L. Erdmann, X. Zhu, K. J. Gabriel, and G. K. Fedder, "Post-CMOS processing for high-aspect-ratio integrated silicon microstructures," *Journal of Microelectromechanical Systems*, vol. 11, pp. 93-101, 2002.
3. H. Qu and H. Xie, "Process Development for CMOS-MEMS Sensors With Robust Electrically Isolated Bulk Silicon Microstructures," *Journal of Microelectromechanical Systems*, vol. 16, pp. 1152-1161, 2007.
4. H. Qu, D. Fang, and H. Xie, "A Monolithic CMOS-MEMS 3-Axis Accelerometer With a Low-Noise, Low-Power Dual-Chopper Amplifier," *IEEE Sensors Journal*, vol. 8, pp. 1511-1518, 2008.

What is claimed is:
1. A method of fabricating a micromachined device, the method comprising:
(a) providing a wafer comprising (i) a substrate having (A) a front side surface and (B) a back side surface opposing the front side surface, (ii) a composite thin film on the front side surface of the substrate, the composite thin film having an internal structure defining one or more etchable portions and one or more etch-resistant portions and including a circuitry layer stack comprising at least one etch resistant metallic layer and insulating material between an uppermost metallic layer and the front side surface of the substrate, and (iii) an etch mask on the back side surface of the substrate, the etch mask defining one or more isolation portions substantially aligned with the etchable portions of the composite thin film;
(b) anisotropically etching the back side of the substrate via the isolation portions of the etch mask, thereby forming one or more first isolation trenches, wherein the first isolation trenches (i) are substantially aligned with the etchable portions of the composite thin film and (ii) extend partially into the substrate;
(c) removing the etch mask;
(d) anisotropically etching the back side of the substrate via the first isolation trenches, thereby extending the first isolation trenches to form one or more second isolation trenches, wherein the second isolation trenches (i) are substantially aligned with the etchable portions of the composite thin film and (ii) extend through the substrate to the composite thin film; and
(e) anisotropically etching the etchable portions of the composite thin film, thereby defining one or more final isolation trenches.

2. The method of claim 1, wherein the etch mask comprises a patterned photoresist layer.

3. The method of claim 2, wherein a patterned insulating layer is disposed between the back side surface of the substrate and the patterned photoresist layer.

4. The method of claim 3, wherein:
(i) the patterned insulating layer defines a microstructure region on the back side surface of the substrate; and
(ii) step (d) further comprises anisotropically and isotropically etching the back side surface of the substrate in the microstructure region, thereby forming a substrate membrane in the microstructure region.

5. The method of claim 4, wherein:
(i) the substrate membrane has a membrane thickness ranging from about 10μm to about 100μm; and
(ii) the final isolation trenches have a width ranging from about 0.5μm to about 5μm and extend through the substrate membrane.

6. The method of claim 1, wherein:
(i) the etch mask further defines one or more separation portions;
(ii) step (b) further comprises anisotropically etching the back side surface of the substrate via the separation portions of the etch mask, thereby forming one or more first separation trenches, wherein the first separation trenches extend partially into the substrate; and
(iii) step (d) further comprises anisotropically etching the back side surface of the substrate via the first separation trenches, thereby extending the first separation trenches to form one or more second separation trenches, wherein the second separation trenches extend through the substrate to the composite thin film layer on the front side surface of the substrate.

7. The method of claim 1, wherein substrate sidewalls of the one or more final isolation trenches are substantially free of contaminants deposited from the composite thin film.

8. The method of claim 1, wherein substrate sidewalls of the one or more final isolation trenches are substantially free of contaminants comprising metal components of the composite thin film.

9. The method of claim 1, wherein:
(i) the insulating material between the uppermost metallic layer of the composite thin film and the front side surface of the substrate comprises a material selected from the group consisting of an oxide and a nitride; and
(ii) each metallic layer of the composite thin film independently comprises a metal selected from the group consisting of aluminum and copper.

10. The method of claim 3, wherein the insulating layer comprises a material selected from the group consisting of an oxide and a nitride.

11. The method of claim 1, wherein anisotropically etching the substrate comprises performing a deep reactive ion etching (DRIE) process.

12. The method of claim 1, wherein the final isolation trenches have an aspect ratio ranging from about 5:1 to about 10:1, the aspect ratio being defined as the height:width ratio of the final isolation trenches.

13. The method of claim 1, wherein:
(i) the wafer is indexed to permit double-sided alignment of the wafer when etching from the front side of the substrate and from the back side of the substrate; and
(ii) the method further comprises flipping over the wafer after anisotropically etching the back side of the substrate via the first isolation trenches and before anisotropically etching the etchable portions of the composite thin film.

14. A method of fabricating a micromachined device, the method comprising:
(a) providing a wafer comprising (i) a substrate having (A) a front side surface, (B) a back side surface opposing the front side surface, and (C) a substrate thickness between the front side surface and the back side surface, and (ii) a composite thin film having (A) a front side surface and (B) a back side surface on the front side surface of the substrate, the composite thin film having an internal structure defining one or more etchable portions and one or more etch-resistant portions and a circuitry layer stack including at least one metallic layer;
(b) depositing an insulating layer over the back side surface of the substrate;
(c) patterning the insulating layer, thereby forming one or more isolation portions of the insulating layer, wherein the isolation portions of the insulating layer are substantially aligned with the etchable portions of the composite thin film;
(d) depositing a photoresist layer over the back side surface of the substrate and over the isolation portions of the insulating layer;
(e) patterning the photoresist layer, thereby defining one or more isolation portions of the photoresist layer, wherein the isolation portions of the photoresist layer are substantially aligned with the etchable portions of the composite thin film;
(f) etching the isolation portions of the insulating layer via the isolation portions of the photoresist layer, thereby exposing the back side surface of the substrate;
(g) anisotropically etching the back side of the substrate via the isolation portions of the photoresist layer, thereby forming one or more first isolation trenches, wherein the first isolation trenches (i) are substantially aligned with the etchable portions of the composite thin film and (ii) extend partially into the substrate;
(h) removing the photoresist layer;
(i) anisotropically etching the back side of the substrate via the first isolation trenches, thereby extending the first isolation trenches to form one or more corresponding second isolation trenches, wherein the second isolation trenches (i) are substantially aligned with the etchable portions of the composite thin film and (ii) extend through the substrate to, but not through, the composite thin film on the front side surface of the substrate; and
(j) anisotropically etching the etchable portions of the composite thin film from the front side surface of the composite thin film and through the composite thin film to the second isolation trenches, thereby defining one or more final isolation trenches.

15. The method of claim 14, wherein:
(i) step (c) further comprises forming a microstructure region on the back side surface of the substrate, the microstructure region being defined by remaining portions of the patterned insulating layer and the isolation portions of the insulating layer;
(ii) step (i) further comprises anisotropically and isotropically etching the back side of the substrate in the microstructure region, thereby forming a substrate membrane in the microstructure region; and
(iii) the composite thin film comprises at least one structural isolation etchable portion that does not correspond to a formed second isolation trench in the microstructure region, step (j) further comprises anisotropically etching the structural isolation etchable portion to expose the underlying substrate, and the method further comprises (k) anisotropically etching the substrate from the front side through the etched structural isolation etchable portion to form a structural trench permitting movable device structures and device release.

16. The method of claim 15, wherein:
(i) the substrate membrane has a membrane thickness ranging from about 10μm to about 100μm; and
(ii) the final isolation trenches have a width ranging from about 5μm to about 10μm and extend through the substrate membrane.

17. The method of claim 14, wherein:
(i) step (e) further comprises defining one or more separation portions of the photoresist layer;
(ii) step (g) further comprises anisotropically etching the back side of the substrate via the separation portions of the photoresist layer, thereby forming one or more first separation trenches, wherein the first separation trenches extend partially into the substrate; and
(iii) step (i) further comprises anisotropically etching the back side of the substrate via the first separation trenches, thereby extending the first separation trenches to form one or more second separation trenches, wherein the second separation trenches extend through the substrate to, but not through, the composite thin film layer on the front side surface of the substrate.

18. The method of claim 14, wherein the substrate is a single-crystal substrate.

19. The method of claim 18, wherein the single crystal substrate comprises a material selected from the group consisting of single-crystal silicon, Si/Ge, and GaAs.

20. The method of claim 14, wherein substrate sidewalls of the one or more final isolation trenches are substantially free of contaminants deposited from the composite thin film.

21. The method of claim 14, wherein substrate sidewalls of the one or more final isolation trenches are substantially free of contaminants comprising metal components of the composite thin film.

22. The method of claim 14, wherein:
(i) the composite thin film layer comprises a complementary metal-oxide-semiconductor (CMOS) circuitry layer stack; and
(ii) the etchable portion comprises an insulating material on the front side surface of the substrate.

23. The method of claim 22, wherein:
(i) the insulating material between an uppermost metallic layer of the composite thin film and the front side surface of the substrate comprises a material selected from the group consisting of an oxide and a nitride; and
(ii) each metallic layer of the composite thin film independently comprises a metal selected from the group consisting of aluminum and copper.

24. The method of claim 14, wherein the insulating layer comprises a material selected from the group consisting of an oxide and a nitride.

25. The method of claim 14, wherein etching the isolation portions of the insulating layer comprises performing a reactive ion etching (RIE) process.

26. The method of claim 14, wherein anisotropically etching the substrate comprises performing a deep reactive ion etching (DRIE) process.

27. The method of claim 14, wherein the final isolation trenches have an aspect ratio ranging from about 5:1 to about 10:1, the aspect ratio being defined as the height:width ratio of the final isolation trenches.

28. The method of claim 14, wherein:
(i) the wafer is indexed to permit double-sided alignment of the wafer when etching from the front side of the substrate and from the back side of the substrate; and
(ii) the method further comprises flipping over the wafer after anisotropically etching the back side of the substrate via the first isolation trenches and before anisotropically etching the etchable portions of the composite thin film.

29. A micromachined device formed according to the method of claim 1.

30. A micromachined device formed according to the method of claim 14.

* * * * *